US011871564B2

(12) United States Patent
Yu

(10) Patent No.: US 11,871,564 B2
(45) Date of Patent: Jan. 9, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 296 days.

(21) Appl. No.: 17/448,521

(22) Filed: Sep. 22, 2021

(65) Prior Publication Data

US 2022/0320113 A1    Oct. 6, 2022

Related U.S. Application Data

(63) Continuation of application No. PCT/CN2021/107740, filed on Jul. 22, 2021.

(30) Foreign Application Priority Data

Mar. 31, 2021   (CN) .......................... 202110351087.7

(51) Int. Cl.
    *H01L 21/76*      (2006.01)
    *H10B 12/00*      (2023.01)
    (Continued)

(52) U.S. Cl.
    CPC ..... *H10B 12/488* (2023.02); *H01L 21/76224* (2013.01); *H01L 21/76877* (2013.01); *H10B 12/30* (2023.02)

(58) Field of Classification Search
None
See application file for complete search history.

(56) References Cited

U.S. PATENT DOCUMENTS 8,921,136 B2 * 12/2014 Chen ...................... H01L 29/78
                                              438/719
2004/0169246 A1   9/2004   Hsieh
(Continued)

FOREIGN PATENT DOCUMENTS

| CN | 1630058 A | 6/2005 |
|---|---|---|
| CN | 101996950 B | 8/2014 |

(Continued)

OTHER PUBLICATIONS

International Search Report in Application No. PCT/CN2021/107740, dated Dec. 17, 2021.

*Primary Examiner* — Bradley Smith
(74) *Attorney, Agent, or Firm* — Syncoda LLC; Feng Ma

(57) ABSTRACT

A semiconductor structure manufacturing method includes: providing a substrate; forming an initial trench in the substrate; forming a sacrificial layer, the sacrificial layer including a first portion and a second portion, the first portion filling the initial trench and the second portion covering an upper surface of the substrate and an upper surface of the first portion; forming a division groove in the second portion, to pattern the second portion into a sacrificial pattern, the sacrificial pattern being arranged corresponding to the first portion; forming a filling layer in the division groove, the filling layer filling the division groove; removing the sacrificial pattern and the first portion, to form a word line trench; and forming a buried gate word line in the word line trench.

20 Claims, 12 Drawing Sheets

(51) Int. Cl.
*H01L 21/762* (2006.01)
*H01L 21/768* (2006.01)

(56) References Cited

U.S. PATENT DOCUMENTS

2019/0206872 A1* 7/2019 Kim .................... H10B 12/485
2021/0375879 A1* 12/2021 Hsu ..................... H10B 12/34

FOREIGN PATENT DOCUMENTS

| CN | 112216699 A | 1/2021 |
| CN | 112563272 A | 3/2021 |
| CN | 113097149 A | 7/2021 |
| CN | 113097150 A | 7/2021 |

* cited by examiner

US 11,871,564 B2

SEMICONDUCTOR STRUCTURE AND MANUFACTURING METHOD THEREOF

CROSS-REFERENCE TO RELATED APPLICATIONS

This is a continuation of International Application No. PCT/CN2021/107740 filed on Jul. 22, 2021, which claims priority to Chinese Patent Application No. 202110351087.7 filed on Mar. 31, 2021. The disclosures of these applications are hereby incorporated by reference in their entirety.

BACKGROUND

As the semiconductor technology develops, dynamic random-access memory (DRAM) evolves towards high speed, high integration density and low power consumption.

SUMMARY

The disclosure relates generally to the technical field of semiconductors, and more specifically to a semiconductor structure and a manufacturing method thereof.

According to various embodiments of the disclosure, a semiconductor structure and a manufacturing method thereof are provided.

The disclosure provides a method for manufacturing a semiconductor structure, the method for manufacturing the semiconductor structure includes:

a substrate is provided;

an initial trench is formed in the substrate;

a sacrificial layer is formed, the sacrificial layer including a first portion and a second portion, the first portion filling the initial trench and the second portion covers an upper surface of the substrate and an upper surface of the first portion;

a division groove is formed in the second portion, to pattern the second portion into a sacrificial pattern, the sacrificial pattern is arranged corresponding to the first portion;

a filling layer is formed in the division groove, the division groove is filled by the filling layer;

the sacrificial pattern and the first portion are removed, to form a word line trench; and a buried gate word line is formed in the word line trench.

The disclosure further provides a semiconductor structure. The semiconductor structure is manufactured by the method for manufacturing a semiconductor structure in any one of the embodiments mentioned above.

BRIEF DESCRIPTION OF THE DRAWINGS

In order to more clearly describe the technical solutions in the embodiments of the disclosure or in the prior art, a brief introduction to the accompanying drawings required for the descriptions of the embodiments or the prior art will be provided below. Obviously, the accompanying drawings in the following descriptions are only some of the embodiments of the disclosure, and those of ordinary skill in the art may also derive other accompanying drawings from these accompanying drawings without making inventive efforts.

REFERENCE NUMERALS

Figure 1:
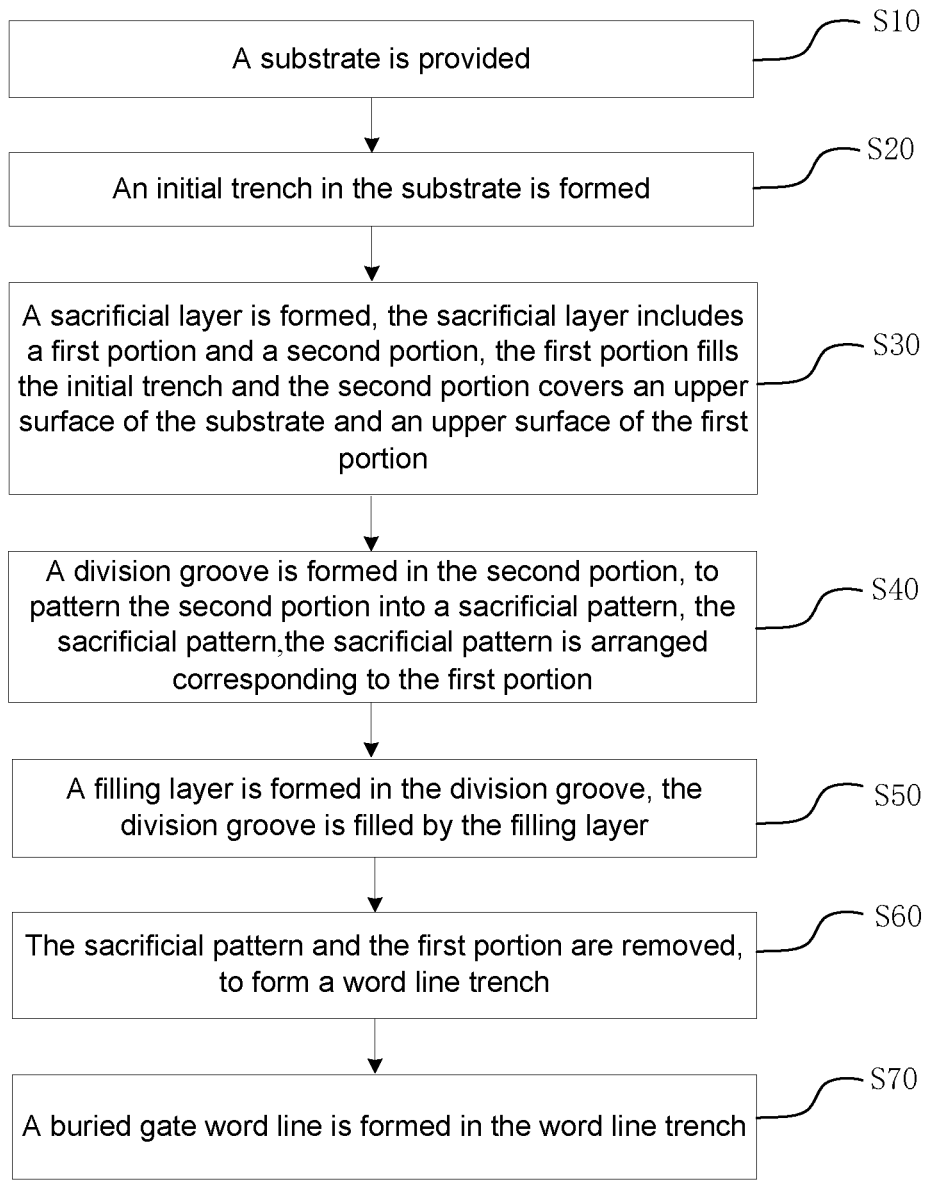
FIG. 1 is a flowchart of a method for manufacturing a semiconductor structure provided according to some embodiments of the disclosure.

101—substrate, 1011—shallow trench isolation structure, 1012—active area, 102—initial trench, 1020—patterned mask layer, 1021—first side wall oxidation layer, 103—sacrificial layer, 1031—first portion, 1032—second portion, 1033—sacrificial pattern, 104—first mask layer, 105—second mask layer, 106—third mask layer, 107—first patterned photoresist layer, 108—side wall pattern, 1081—side wall material layer, 109—division groove, 1101—filling material layer, 1102—filling layer, 111—word line trench, 112—gate oxidation layer, 113—conductive layer, 114—fourth mask layer, 115—second patterned photoresist layer, 116—isolation groove, 1161—isolation structure, 117—top dielectric layer and 118—buried gate word line.

DETAILED DESCRIPTION

For ease of understanding, the disclosure will be described more comprehensively below with reference to the related accompanying drawings. The accompanying drawings show the preferred embodiments of the disclosure. However, the disclosure may be implemented in numerous different forms, instead of being limited to the embodiments described herein. On the contrary, these embodiments are provided for making disclosed contents of the disclosure more thorough and comprehensive.

Unless otherwise defined, all technical and scientific terms used herein have the same meanings as generally understood by those skilled in the art of the disclosure. The terms used herein in the description of the disclosure are merely to describe the specific embodiments, instead of being intended to limit the disclosure.

It is to be understood that when an element or a layer is referred to as "on . . . ", "adjacent to . . . ", "connected to", or "coupled to" another element or layer, it may be directly on, adjacent to, connected to, or coupled to another element or layer, or an intermediate element or layer may exist. On the contrary, when an element is referred to as "directly on . . . ", "adjacent to . . . directly", "directly connected to", or "directly coupled to" another element or layer, no intermediate element or layer exists. It is to be understood that although the terms first, second, third, etc. may be used to describe various elements, parts, areas, layers, doping types and/or portions, such elements, parts, areas, layers, doping types and/or portions should not be limited by these terms. These terms are merely used to distinguish one element, part, area, layer, doping type or portion from another element, part, area, layer, doping type or portion. Therefore, a first element, part, area, layer, doping type or portion discussed below may be referred to as a second element, part, area, layer, or portion without departing from the teachings of the disclosure. For example, the first portion may be referred to as the second portion, and similarly, the second portion may be referred to as the first portion, where the first portion and the second portion are sacrificial layers.

The spatial relation terms such as "under . . . ", "below . . . ", "on a lower portion", "underneath . . . ", "above . . . " and "on" may be used herein to describe the relation between one element or feature and another element or feature illustrated in the figures. It is to be understood that the spatial relation terms further include different orientations of a device in use and operation, in addition to the orientations shown in the figures. For example, an element or feature described as "below another element", "on its lower portion" or "under same" will be oriented "above" another element or feature when a device in the accompanying drawings is turned over. Thus, the exemplary terms "below . . . " and "under . . . " may include two orientations of up and down. In addition, the device may also include additional orientations (for example, rotation by 90 degrees or other orientations), and the spatial descriptors used herein are interpreted accordingly.

As used herein, the singular forms "a", "an" and "the/this" may also include the plural forms, unless the context clearly indicates an additional form. In addition, it is to be understood that when the terms "consisting of" and/or "comprising" are used in the description, the presence of the feature, integer, step, operation, element and/or part may be determined, without excluding the presence or addition of one or more other features, integers, steps, operations, elements, parts and/or groups. Also, as used herein, the term "and/or" includes any and all combinations of the related listed items.

The embodiments of the disclosure are described herein with reference to the cross-sectional views which are the schematic diagrams of the embodiments (and intermediate structures) of the disclosure, and therefore, variations in illustrated shapes due to, for example, manufacturing techniques and/or tolerances may be contemplated. Thus, the embodiments of the disclosure should include deviations in shapes due to, for example, the manufacturing techniques, instead of being limited to a particular shape of an area shown herein.

With the structural size of a semiconductor device miniaturized, especially in the manufacturing process of a DRAM with a critical size less than 20 nm, the size of word lines and the effective channel length directly determine whether the DRAM has the desirable electrical property. In addition, in the manufacturing process of the DRAM, with the critical size reduced, the manufacturing requirements for the word line are increasingly higher, which have reached the limit of the etching process. The balance between the high depth and the size is unattainable, and the ideal trench length is difficult to obtain. As such, the inventor of the present disclosure has recognized that it is urgent to solve the size of buried gate word lines in the 1z era.

Figure 2:
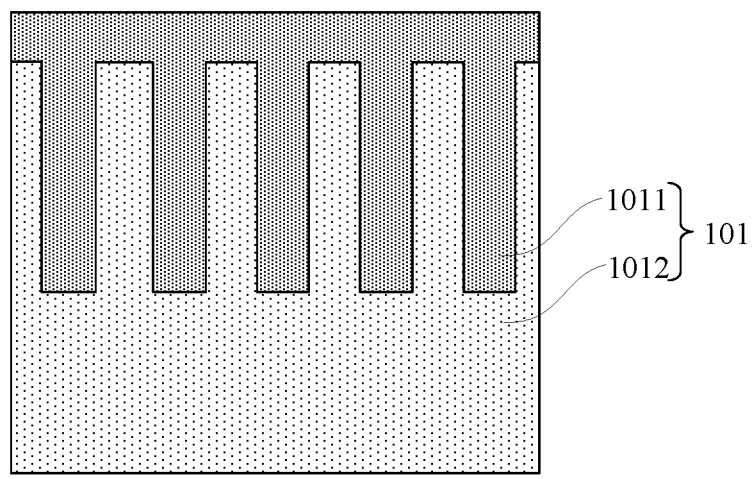
FIG. 2 is a schematic sectional view of a structure obtained in S10 in the method for manufacturing a semiconductor structure provided according to some embodiments of the disclosure.

With reference to FIG. 1, the disclosure provides a method for manufacturing a semiconductor structure, the method for manufacturing the semiconductor structure includes:

S10: as shown in FIG. 2, a substrate 101 is provided;

S20: an initial trench 102 in the substrate 101 is formed;

S30: a sacrificial layer 103 is formed, the sacrificial layer 103 includes a first portion 1031 and a second portion 1032, the first portion 1031 fills the initial trench 102 and the second portion 1032 covers an upper surface of the substrate 101 and an upper surface of the first portion 1031;

S40: a division groove 109 is formed in the second portion 1032, to pattern the second portion 1032 into a sacrificial pattern 1033, the sacrificial pattern 1033, the sacrificial pattern 1033 is arranged corresponding to the first portion 1031;

S50: a filling layer 1102 is formed in the division groove 109, the division groove 109 is filled by the filling layer 1102;

S60: the sacrificial pattern 1033 and the first portion 1031 are removed, to form a word line trench 111; and S70: a buried gate word line 118 is formed in the word line trench 111.

According to the method for manufacturing a semiconductor structure in the embodiment mentioned above, by forming the trench in two steps, the buried gate word line is half located in an active area, so as to lower a requirement for an etching process, ensure an implementability of the process and obtain an ideal channel length. Therefore, the semiconductor structure is still insusceptible to short channel effects when an overall size is miniaturized in a 1z era.

Particularly, the substrate 101 may include, but is not limited to, a silicon substrate. A shallow trench isolation structure 1011 is formed in the substrate 101, the shallow trench isolation structure 1011 isolates several active areas 1012 arranged in an array from one another in the substrate 101.

Figure 3:
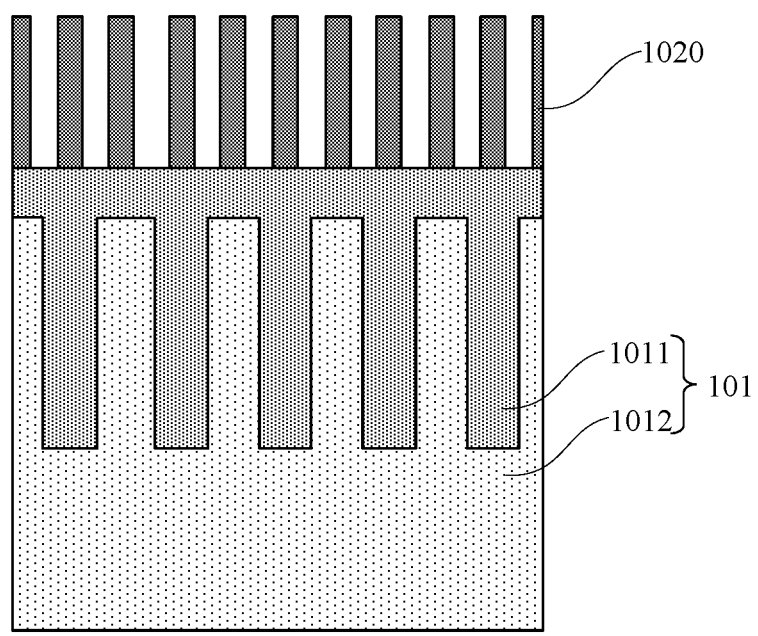
FIG. 3 is a schematic sectional view of a structure obtained in a step of forming a patterned mask layer on an upper surface of a substrate in the method for manufacturing a semiconductor structure provided according to some embodiments of the disclosure.
Figure 4:
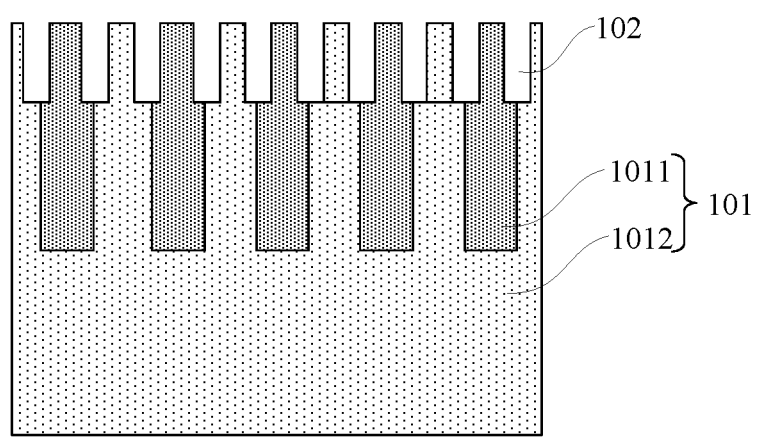
FIG. 4 is a schematic sectional view of a structure obtained in S20 in the method for manufacturing a semiconductor structure provided according to some embodiments of the disclosure.

Particularly, according to some embodiments, S20 includes:

as shown in FIG. 3, a patterned mask layer 1020 is formed on the upper surface of the substrate 101; and as shown in FIG. 4, the substrate 101 is patterned, based on the patterned mask layer 1020, to form the initial trench 102, where particularly, the etching process may be used to etch the substrate 101, to pattern the substrate 101. The method further includes: remove the patterned mask layer 1020 after the initial trench 102 is formed.

Figure 5:
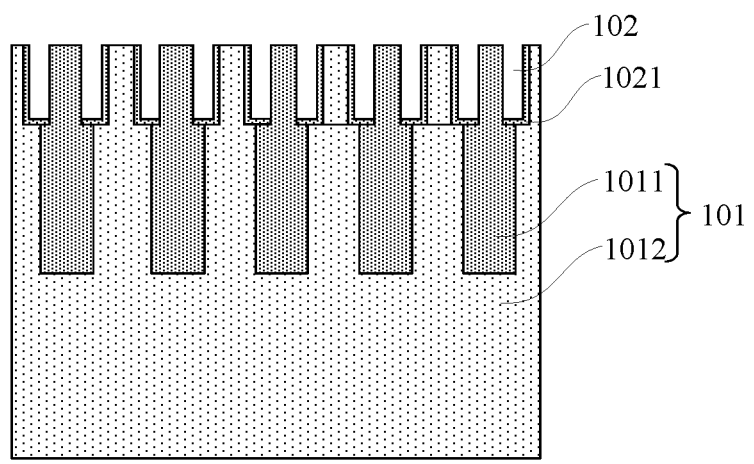
FIG. 5 is a schematic sectional view of a structure obtained in a step of forming a first side wall oxidation layer on side walls of an initial trench in the method for manufacturing a semiconductor structure provided according to some embodiments of the disclosure.

Particularly, according to some embodiments, before S30, the method further includes:

as shown in FIG. 5, a first side wall oxidation layer 1021 is formed on side walls of the initial trench 102. Particularly, the first side wall oxidation layer 1021 may be formed through, but not limited to, a thermal oxidation process.

Figure 6:
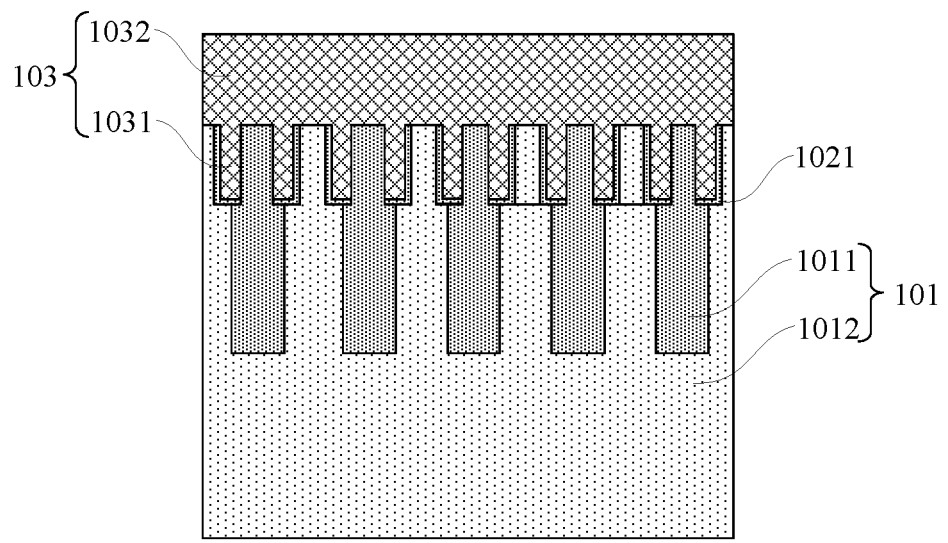
FIG. 6 is a schematic sectional view of a structure obtained in S60 in the method for manufacturing a semiconductor structure provided according to some embodiments of the disclosure.

Particularly, according to some embodiments, S30 is as shown in FIG. 6.

The sacrificial layer 103 may be made from, but not limited to, any one or more of titanium nitride, polycrystalline silicon, boro phospho silicate glass (BPSG), or silicon dioxide, etc., and the disclosure does not limit a material of the sacrificial layer 103. Particularly, according to some embodiments, the sacrificial layer 103 includes a titanium nitride layer.

In S40 of one embodiment, the division groove 109 is formed based on a self-aligned double patterning process.

Figure 7:
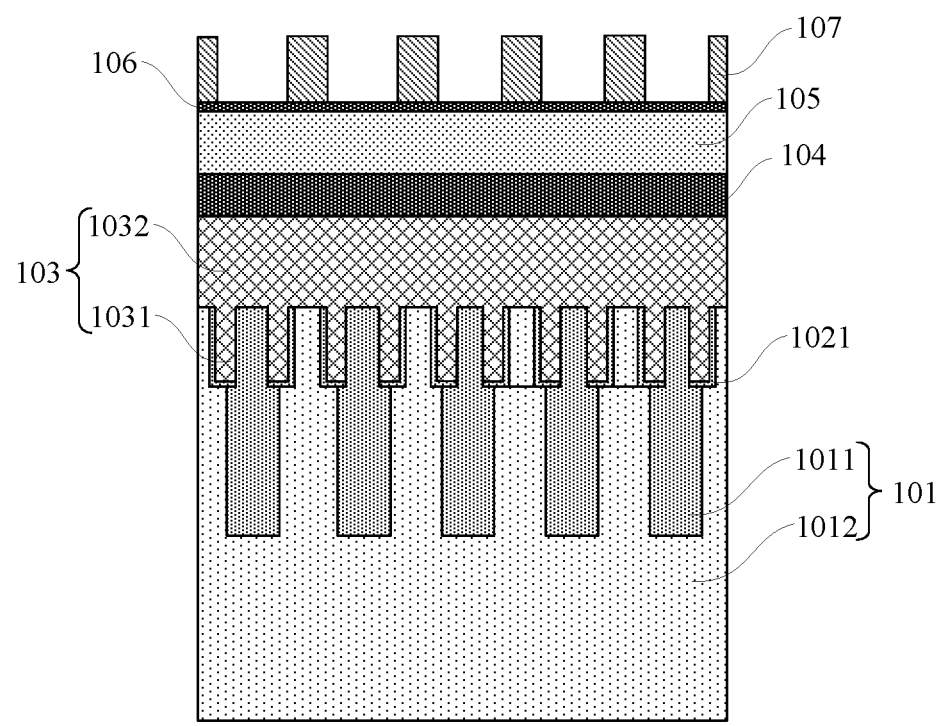
FIG. 7 is a schematic sectional view of a structure obtained in a step of forming a first mask layer, a second mask layer, a third mask layer and a first patterned photoresist layer, which are stacked from bottom to top in sequence, on an upper surface of a sacrificial layer in the method for manufacturing a semiconductor structure provided according to some embodiments of the disclosure.
Figure 8:
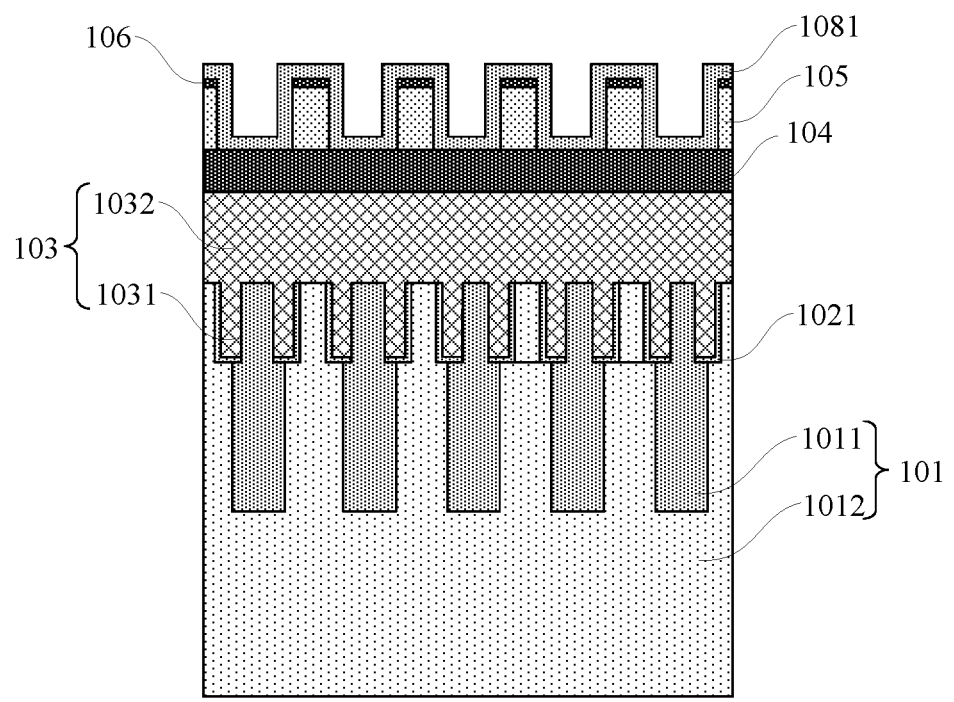
FIG. 8 is a schematic sectional view of a structure obtained in a step of transferring a pattern of the first patterned photoresist layer to the second mask layer in the method for manufacturing a semiconductor structure provided according to some embodiments of the disclosure.
Figure 9:
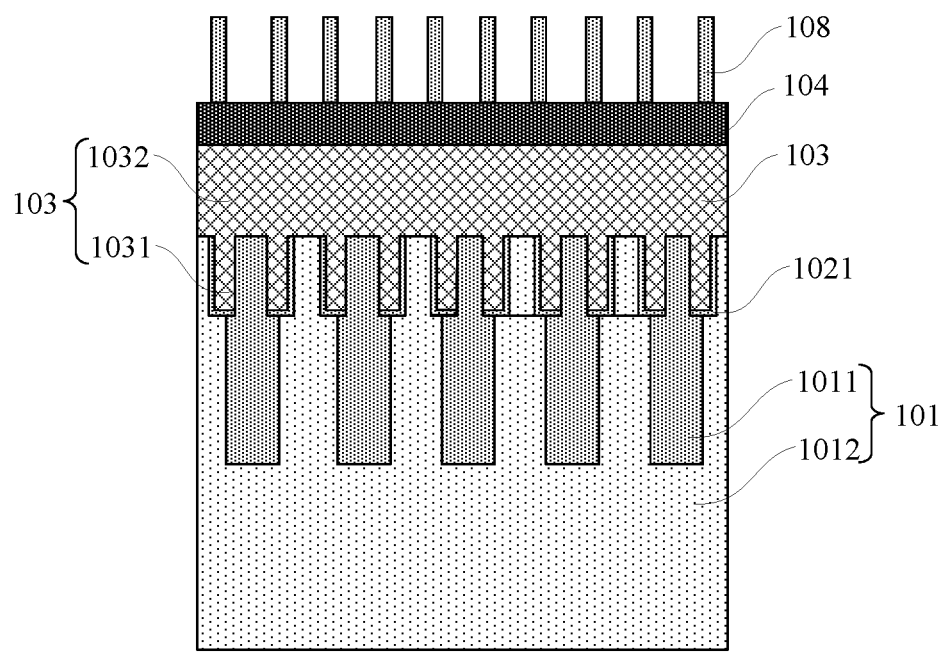
FIG. 9 is a schematic sectional view of a structure obtained in a step of converting the first patterned photoresist layer to a side wall pattern in the method for manufacturing a semiconductor structure provided according to some embodiments of the disclosure.
Figure 10:
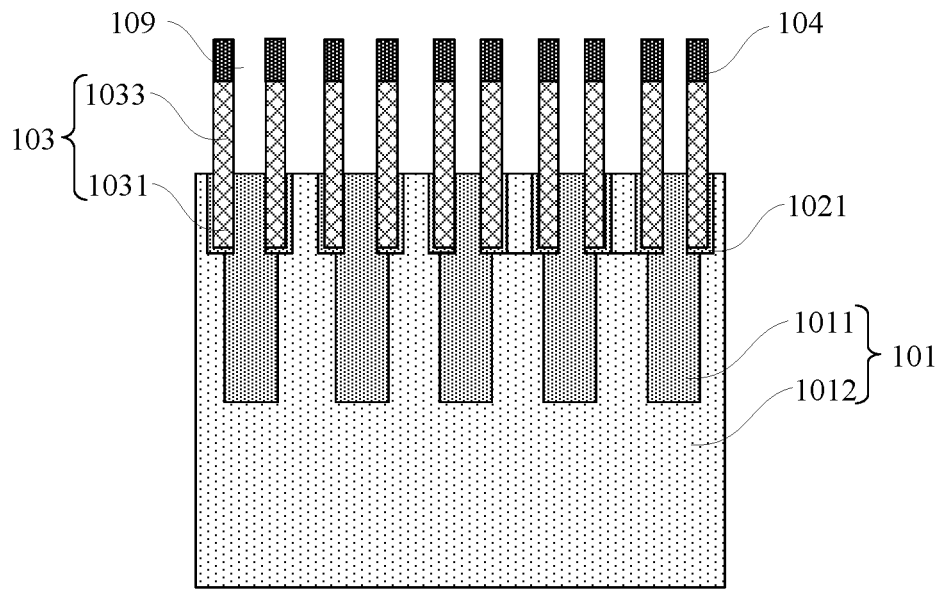
FIG. 10 is a schematic sectional view of a structure obtained in S40 in the method for manufacturing a semiconductor structure provided according to some embodiments of the disclosure.

Particularly, according to some embodiments, S40 includes:

as shown in FIG. 7, a first mask layer 104, a second mask layer 105, a third mask layer 106 and a first patterned photoresist layer 107 are formed, which are stacked from bottom to top in sequence, on an upper surface of the sacrificial layer 103;

as shown in FIG. 8, photoetch and etch a structure obtained in the step mentioned above, to transfer a pattern of the first patterned photoresist layer 107 to the third mask layer 106 and the second mask layer 105, to obtain the sacrificial pattern; form a side wall material layer 1081 on side walls of the sacrificial pattern, a top of the sacrificial pattern and an exposed portion of a surface of the first mask layer 104;

as shown in FIG. 9, a portion, on the top of the sacrificial pattern, of the side wall material layer 1081 is removed and a portion, on the surface of the first mask layer 104, of the side wall material layer 1081, to obtain a side wall pattern 108; and as shown in FIG. 10, based on the side wall pattern 108, the division groove 109 in the second portion 1032 is formed.

Figure 11:
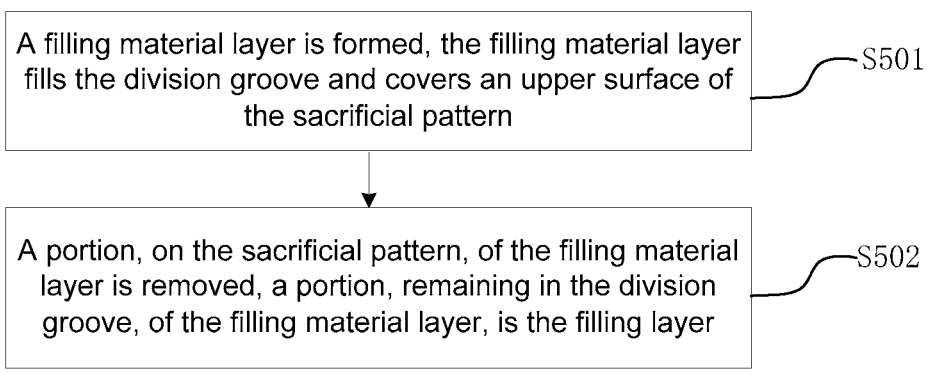
FIG. 11 is a flowchart of S50 in the method for manufacturing a semiconductor structure provided according to some embodiments of the disclosure.
Figure 12:
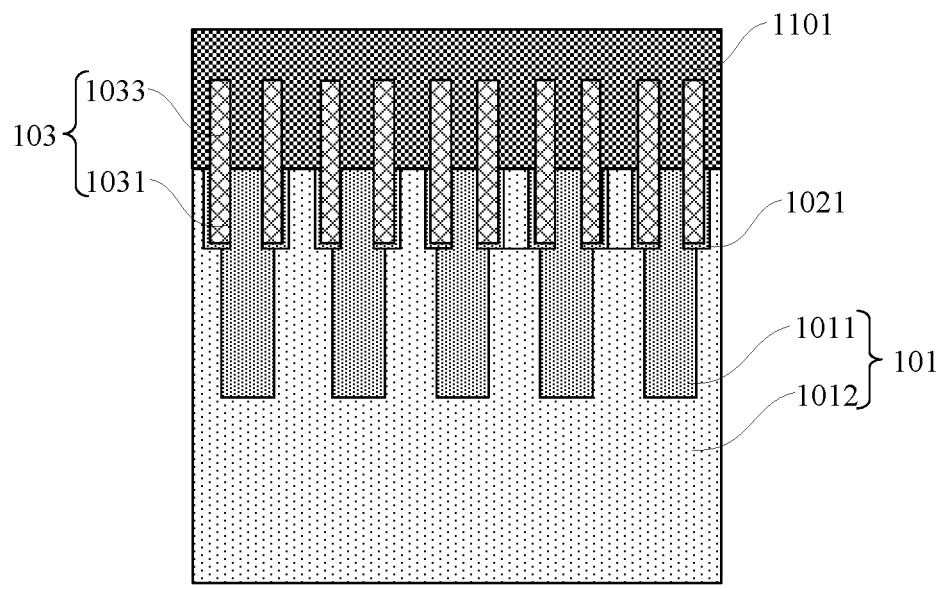
FIG. 12 is a schematic sectional view of a structure obtained in S501 in the method for manufacturing a semiconductor structure provided according to some embodiments of the disclosure.
Figure 13:
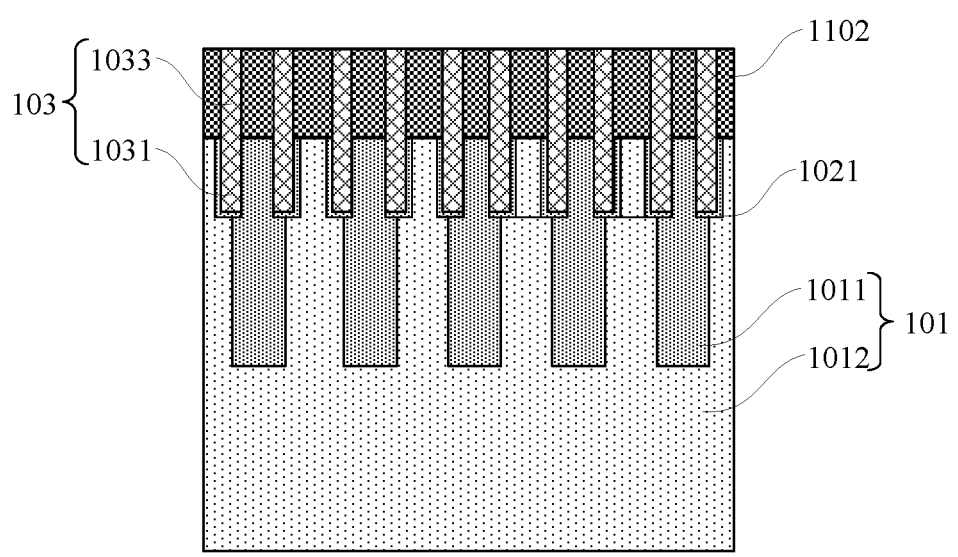
FIG. 13 is a schematic sectional view of a structure obtained in S502 in the method for manufacturing a semiconductor structure provided according to some embodiments of the disclosure.

With reference to FIG. 11, according to some embodiments, S50 includes:

S501: as shown in FIG. 12, a filling material layer 1101 is formed, the filling material layer 1101 fills the division groove 109 and covers an upper surface of the sacrificial pattern 1033; and S502: as shown in FIG. 13, a portion, on the sacrificial pattern 1033, of the filling material layer 1101 is removed, a portion, remaining in the division groove 109, of the filling material layer 1101, is the filling layer 1102.

The filling layer 1102 may be made from, but not limited to, any one or more of silicon, doped silicon, etc., and the disclosure does not limit a material of the filling layer 1102. Particularly, according to some embodiments, the filling layer 1102 includes a doped silicon layer.

Figure 14:
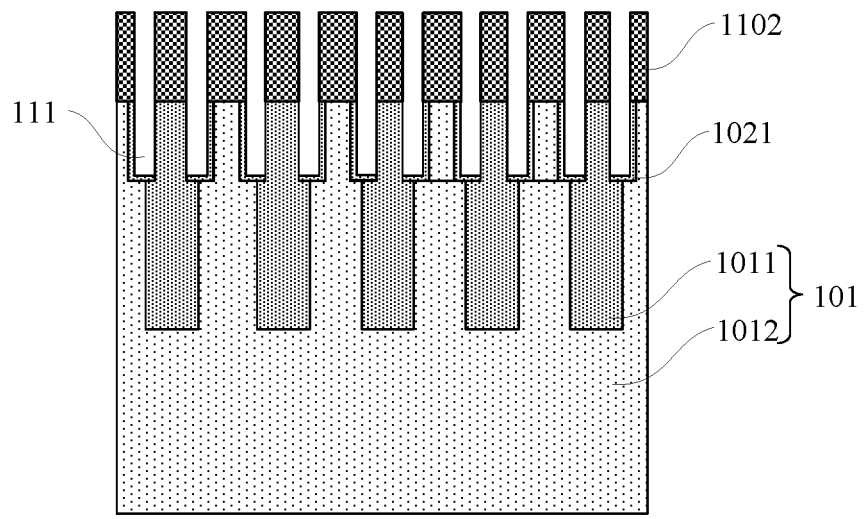
FIG. 14 is a schematic sectional view of a structure obtained in S60 in the method for manufacturing a semiconductor structure provided according to some embodiments of the disclosure.

Particularly, according to some embodiments, S60 is as shown in FIG. 14.

Figure 15:
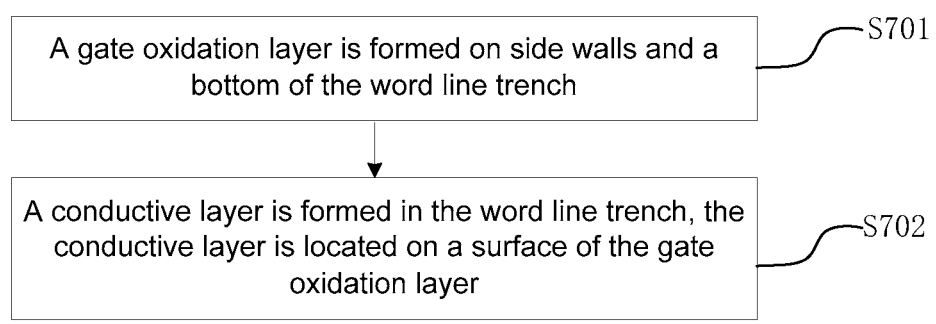
FIG. 15 is a flowchart of S70 in the method for manufacturing a semiconductor structure provided according to some embodiments of the disclosure.
Figure 16:
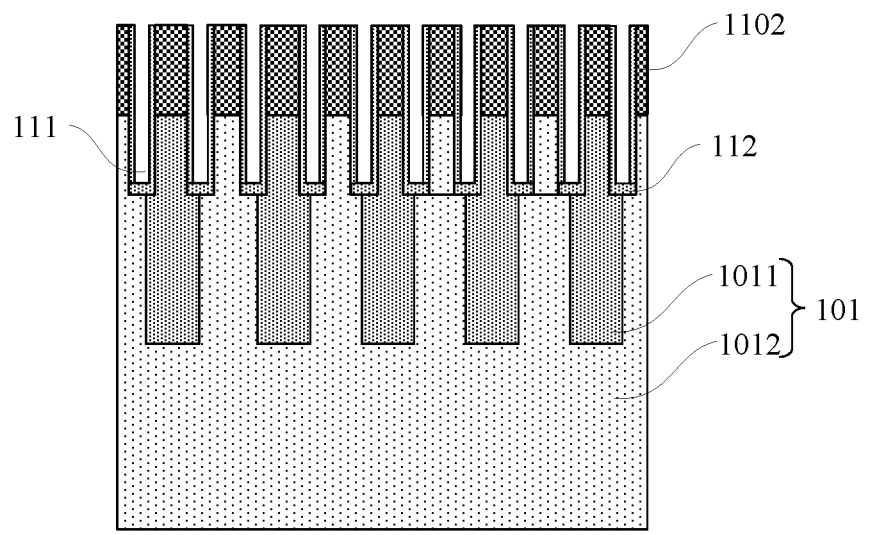
FIG. 16 is a schematic sectional view of a structure obtained in S701 in the method for manufacturing a semiconductor structure provided according to some embodiments of the disclosure.

With reference to FIG. 15, according to some embodiments, S70 includes:

S701: as shown in FIG. 16, a gate oxidation layer 112 is formed on side walls and a bottom of the word line trench 111; and S702, a conductive layer 113 is formed in the word line trench 111, the conductive layer 113 is located on a surface of the gate oxidation layer 112.

It might be understood that according to some embodiments, a second side wall oxidation layer (not shown) is formed on side walls of the filling layer 1102, the second side wall oxidation layer and the first side wall oxidation layer 1021 jointly form the gate oxidation layer 112. In other embodiments, the gate oxidation layer 112 is directly formed on the side walls and the bottom of the word line trench 111, without forming the first side wall oxidation layer 1021 on the side walls of the initial trench 102.

In S701 of one embodiment, the gate oxidation layer 112 is formed on the side walls and the bottom of the word line trench 111 by, but not limited to, performing a heat treatment on an obtained structure.

Figure 17:
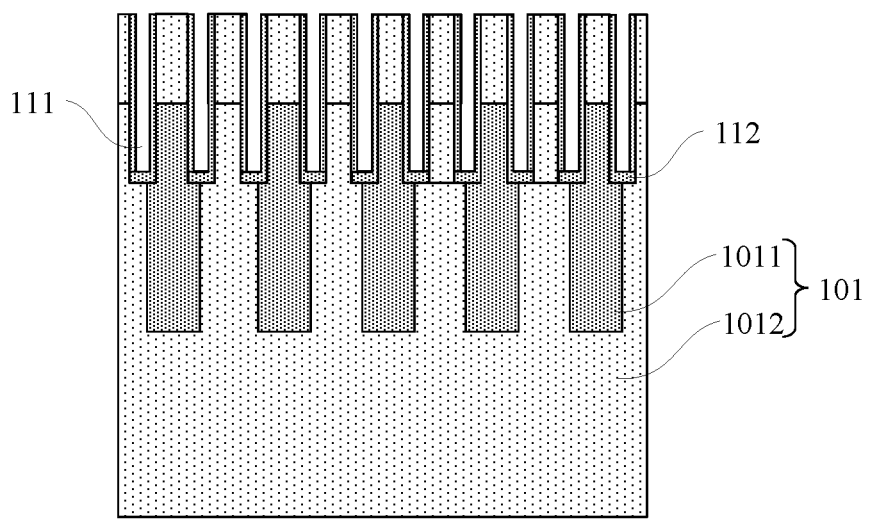
FIG. 17 is a schematic sectional view of a structure obtained after the filling layer undergoes crystal fusion of silicon ions in the method for manufacturing a semiconductor structure provided according to some embodiments of the disclosure.

According to some embodiments, as shown in FIG. 17, in a process of performing the heat treatment on the obtained structure, the filling layer 1102 undergoes crystal fusion of silicon ions.

Figure 18:
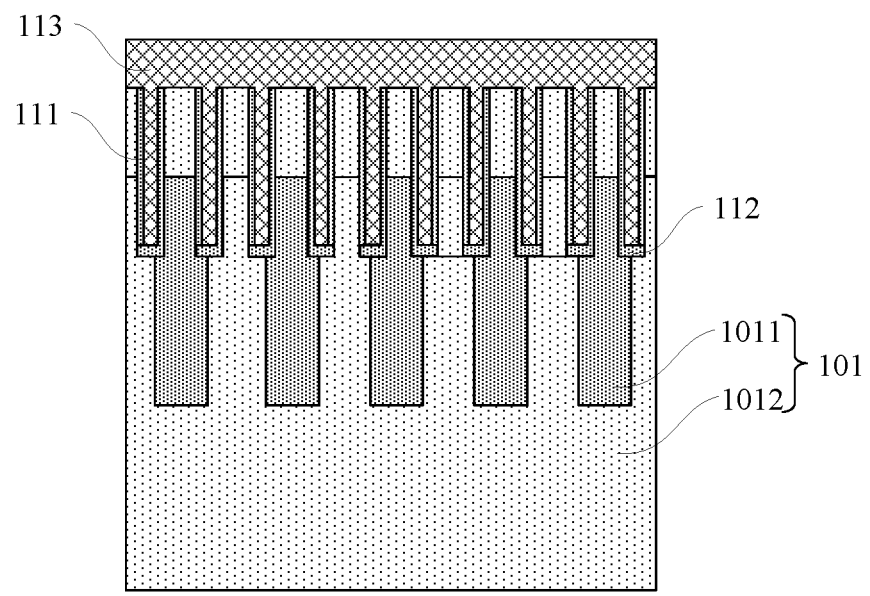
FIG. 18 is a schematic sectional view of a structure obtained in S702 in the method for manufacturing a semiconductor structure provided according to some embodiments of the disclosure.

Particularly, according to some embodiments, S702 is as shown in FIG. 18.

According to some embodiments, after the heat treatment, a filling layer 1102 is located on a portion, between the word line trenches 111, of the active area 1012 and an upper surface of the shallow trench isolation structure 1011.

In the embodiment mentioned above, a process of forming the conductive layer 113 may further include:

a portion, on the upper surface of the shallow trench isolation structure 1011, of the filling layer 1102 is removed, to form an isolation groove 116 above the shallow trench isolation structure 1011.

Figure 19:
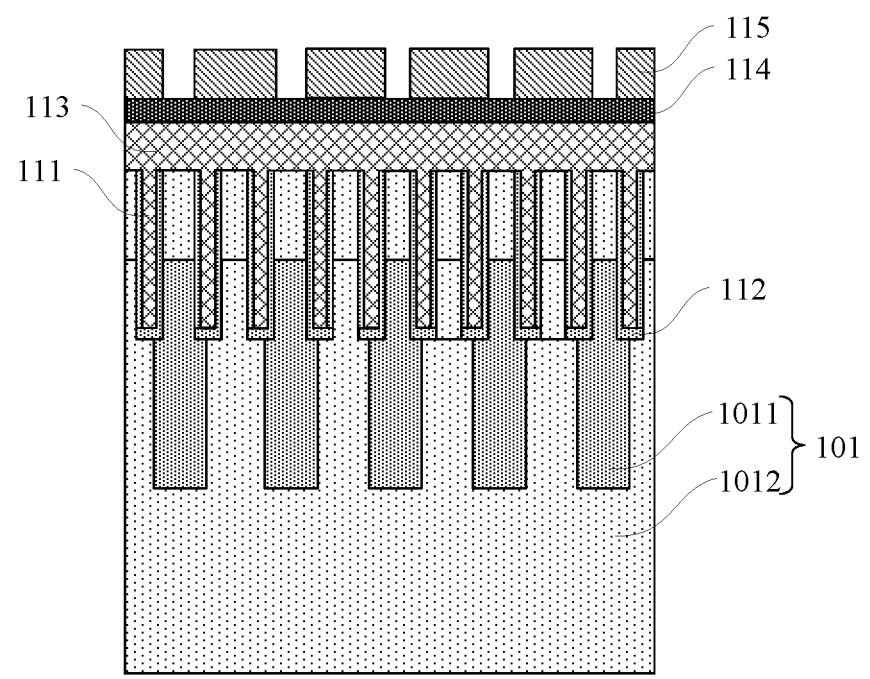
FIG. 19 is a schematic sectional view of a structure obtained in a step of forming a fourth mask layer and a second patterned photoresist layer, which are stacked from bottom to top in sequence, on an upper surface of a conductive layer in the method for manufacturing a semiconductor structure provided according to some embodiments of the disclosure.
Figure 20:
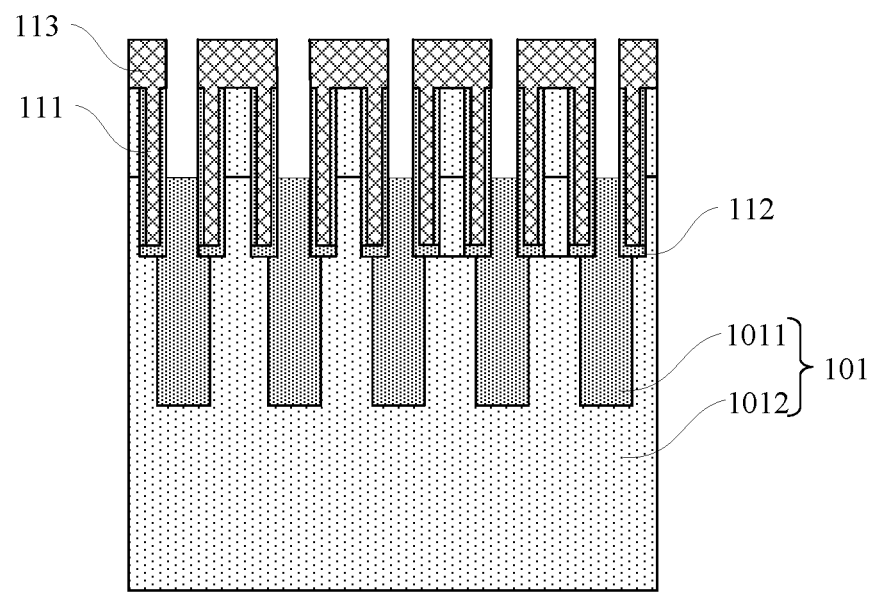
FIG. 20 is a schematic sectional view of a structure obtained by patterning the structure in FIG. 19 in the method for manufacturing a semiconductor structure provided according to some embodiments of the disclosure.

Particularly, according to some embodiments, a step of removing the portion, on the upper surface of the shallow trench isolation structure 1011, of the filling layer 1102, to form the isolation groove 116 above the shallow trench isolation structure 1011 particularly includes:

as shown in FIG. 19, a fourth mask layer 114 and a second patterned photoresist layer 115 are formed, which are stacked from bottom to top in sequence, on an upper surface of the conductive layer 113;

as shown in FIG. 20, a structure obtained in the step mentioned above is patterned; and as shown in FIG. 21, the isolation groove 116 is formed above the shallow trench isolation structure 1011.

Figure 21:
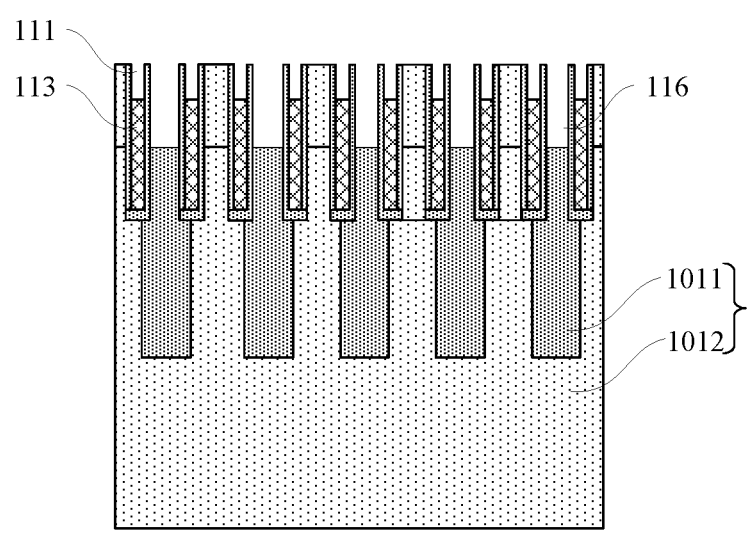
FIG. 21 is a schematic sectional view of a structure obtained in a step of forming an isolation groove above a shallow trench isolation structure in the method for manufacturing a semiconductor structure provided according to some embodiments of the disclosure.

With continued reference to FIG. 21, according to some embodiments, the upper surface of the conductive layer 113 is lower than an upper surface of the word line trench 111.

Figure 22:
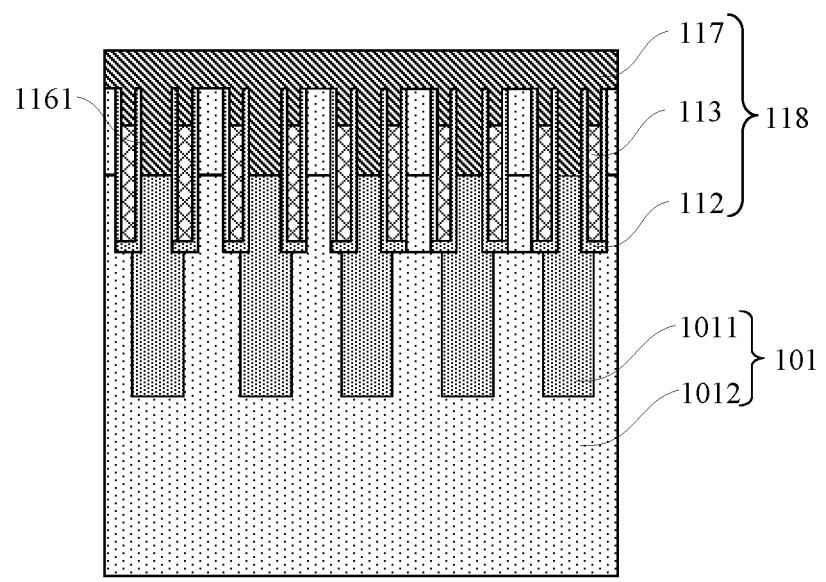
FIG. 22 is a schematic sectional view of a structure obtained in a step of forming a top dielectric layer in a word line trench and an isolation structure in the isolation groove, the top dielectric layer, the conductive layer and a gate oxidation layer jointly form a buried gate word line in the method for manufacturing a semiconductor structure provided according to some embodiments of the disclosure, and a schematic diagram of a semiconductor structure provided according to some embodiments of the disclosure.

In the embodiment mentioned above, after S702, the method may further include:

as shown in FIG. 22, a top dielectric layer 117 is formed in the word line trench 111 and an isolation structure 1161 in the isolation groove 116, the top dielectric layer 117, the conductive layer 113 and the gate oxidation layer 112 jointly form the buried gate word line 118.

With continued reference to FIG. 22, according to some embodiments, a step of forming the top dielectric layer 117 in the word line trench 111 and the isolation structure 1161 in the isolation groove 116 may include:

a filling dielectric layer (not shown) is formed in the word line trench 111 and the isolation groove 116, a portion, in the word line trench 111, of the filling dielectric layer is the top dielectric layer 117 and a portion, in the isolation groove 116, of the filling dielectric layer is the isolation structure 1161.

By arranging the isolation structure 1161, the isolation structure 1161 may isolate adjacent buried gate word lines 118 from each other, and the buried gate word line 118 from the active area 1012, to avoid electric leakage from between the adjacent buried gate word lines 118 and between the buried gate word line 118 and the active area 1012.

With continued reference to FIG. 22, according to some embodiments, the filling dielectric layer further covers an upper surface of the buried gate word line 118 and an upper surface of the isolation structure 1161.

The filling dielectric layer may be made from, but not limited to, any one or more of silicon nitride, silicon oxide, etc., and the disclosure does not limit a material of the filling dielectric layer. Particularly, in the present embodiment, a silicon nitride layer is formed in the word line trench 111 and the isolation groove 116 to serve as the filling dielectric layer.

Figure 23:
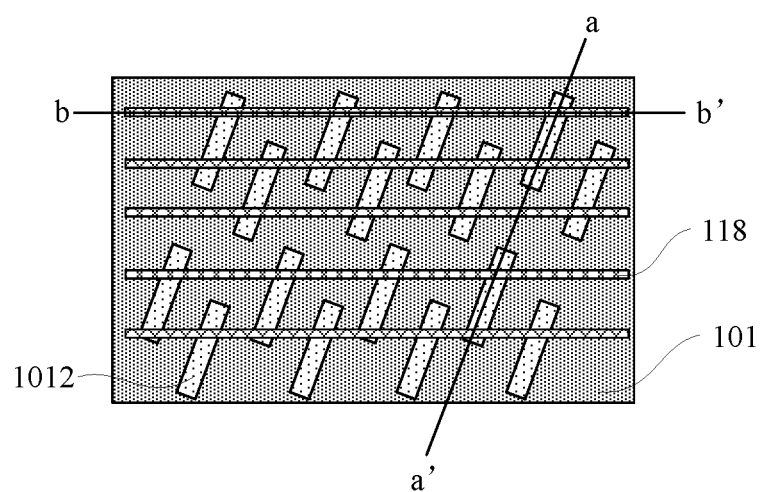
FIG. 23 is a structural schematic diagram of a top view of a structure obtained through the method for manufacturing a semiconductor structure provided according to some embodiments of the disclosure.

With reference to FIG. 23, according to some embodiments, the active area 1012 extends in a first direction aa', and the buried gate word line 118 extends in a second direction bb', the second direction bb' intersecting the first direction aa'. It should be noted that the isolation structure 1161 is not illustrated in FIG. 23.

With continued reference to FIG. 22, the disclosure further provides a semiconductor structure. The semiconductor structure is manufactured by a method for manufacturing a semiconductor structure provided in any one of the embodiments mentioned above.

The semiconductor structure in the embodiment mentioned above is provided with a funnel trapezoidal word line structure. The structure extends an effective channel length in channels on two sides of the word line, and therefore, the semiconductor structure may still have the ideal channel length and not be influenced by the short channel effects when the overall size is miniaturized in the $1z$ era.

It should be understood that although various steps in flowcharts in FIGS. 1, 11 and 15 are shown in sequence as indicated by arrows, these steps are not necessarily performed in sequence as indicated by the arrows. Unless expressly described herein, these steps may be performed in other sequences, instead of being limited to a strict sequence. Moreover, at least some steps in FIGS. 1, 11 and 15 may include a plurality of steps or stages. These steps or stages may be performed at different times, instead of necessarily at the same time. Instead of being performed necessarily in sequence, these steps or stages and other steps or at least some steps or stages in other steps may be performed in turn or alternately.

Various technical features of the embodiments mentioned above may be randomly combined. In order to make the descriptions concise, not all possible combinations of all the technical features of the embodiments mentioned above are described. However, as long as there is no contradiction in combination of these technical features, it should be deemed to fall within the scope in the present description.

The embodiments mentioned above are merely several implementations of the disclosure which are described particularly and minutely, but are not to be construed as limiting the scope of the disclosure. It should be pointed out that without departing from the concept of the disclosure, those of ordinary skill in the art may also make several modifications and improvements which fall within the scope of protection of the disclosure. Therefore, the scope of protection of the disclosure should be subject to the appended claims.

What is claimed is:

1. A method for manufacturing a semiconductor structure, comprising:
   providing a substrate;
   forming an initial trench in the substrate;
   forming a sacrificial layer, the sacrificial layer comprising a first portion and a second portion, the first portion filling the initial trench and the second portion covering an upper surface of the substrate and an upper surface of the first portion;
   forming a division groove in the second portion, to pattern the second portion into a sacrificial pattern, the sacrificial pattern being arranged corresponding to the first portion;
   forming a filling layer in the division groove, the filling layer filling the division groove;
   removing the sacrificial pattern and the first portion, to form a word line trench; and
   forming a buried gate word line in the word line trench.

2. The method for manufacturing a semiconductor structure according to claim 1, wherein the division groove is formed based on a self-aligned double patterning process.

3. The method for manufacturing a semiconductor structure according to claim 1, wherein the sacrificial layer comprises a titanium nitride layer.

4. The method for manufacturing a semiconductor structure according to claim 1, wherein said forming the filling layer in the division groove, the filling layer filling the division groove comprises:
   forming a filling material layer, the filling material layer filling the division groove and covering an upper surface of the sacrificial pattern; and
   removing a portion, on the sacrificial pattern, of the filling material layer, a portion, remaining in the division groove, of the filling material layer being the filling layer.

5. The method for manufacturing a semiconductor structure according to claim 1, wherein said forming the buried gate word line in the word line trench comprises:
   forming a gate oxidation layer on side walls and a bottom of the word line trench; and
   forming a conductive layer in the word line trench, the conductive layer being located on a surface of the gate oxidation layer.

6. The method for manufacturing a semiconductor structure according to claim 5, wherein said forming the gate oxidation layer on the side walls and the bottom of the word line trench comprises:
   performing a heat treatment on an obtained structure, to form the gate oxidation layer on the side walls and the bottom of the word line trench.

7. The method for manufacturing a semiconductor structure according to claim 6, wherein the filling layer comprises a silicon layer.

8. The method for manufacturing a semiconductor structure according to claim 7, wherein in a process of performing the heat treatment on the obtained structure, the filling layer undergoes crystal fusion of silicon ions.

9. The method for manufacturing a semiconductor structure according to claim 8, wherein a shallow trench isolation structure is formed in the substrate, the shallow trench isolation structure isolates several active areas arranged in an array in the substrate; the filling layer after the heat treatment is located on a portion, between the word line trenches, of the active area and an upper surface of the shallow trench isolation structure; and a process of forming the conductive layer further comprises: removing a portion, on the upper surface of the shallow trench isolation structure, of the filling layer, to form an isolation groove above the shallow trench isolation structure.

10. The method for manufacturing a semiconductor structure according to claim 9, wherein an upper surface of the conductive layer is lower than an upper surface of the word line trench, and after forming the conductive layer, the method further comprises:
    forming a top dielectric layer in the word line trench and an isolation structure in the isolation groove, the top dielectric layer, the conductive layer and the gate oxidation layer jointly forming the buried gate word line.

11. The method for manufacturing a semiconductor structure according to claim 10, wherein the forming the top dielectric layer in the word line trench and the isolation structure in the isolation groove comprises:
    forming a filling dielectric layer in the word line trench and the isolation groove, a portion, in the word line trench, of the filling dielectric layer being the top dielectric layer and a portion, in the isolation groove, of the filling dielectric layer being the isolation structure.

12. The method for manufacturing a semiconductor structure according to claim 11, wherein the filling dielectric layer further covers an upper surface of the buried gate word line and an upper surface of the isolation structure.

13. The method for manufacturing a semiconductor structure according to claim 11, wherein a silicon nitride layer is formed in the word line trench and the isolation groove to serve as the filling dielectric layer.

14. The method for manufacturing a semiconductor structure according to claim 9, wherein the active area extends in a first direction, and the buried gate word line extends in a second direction, the second direction intersecting the first direction.

15. A semiconductor structure manufactured with the method according to claim 1.

16. The semiconductor structure according to claim 15, wherein said forming the filling layer in the division groove, the filling layer filling the division groove comprises:
    forming a filling material layer, the filling material layer filling the division groove and covering an upper surface of the sacrificial pattern; and
    removing a portion, on the sacrificial pattern, of the filling material layer, a portion,
    remaining in the division groove, of the filling material layer being the filling layer.

17. The semiconductor structure according to claim 15, wherein said forming the buried gate word line in the word line trench comprises:
    forming a gate oxidation layer on side walls and a bottom of the word line trench; and
    forming a conductive layer in the word line trench, the conductive layer being located on a surface of the gate oxidation layer.

18. The semiconductor structure according to claim 17, wherein said forming the gate oxidation layer on the side walls and the bottom of the word line trench comprises:
    performing a heat treatment on an obtained structure, to form the gate oxidation layer on the side walls and the bottom of the word line trench.

19. The semiconductor structure according to claim 17, wherein the filling layer comprises a silicon layer.

20. The semiconductor structure according to claim 17, wherein in a process of performing the heat treatment on the obtained structure, the filling layer undergoes crystal fusion of silicon ions.

* * * * *